United States Patent [19]

Hollinger

[11] Patent Number: 4,766,094
[45] Date of Patent: Aug. 23, 1988

[54] SEMICONDUCTOR DOPING PROCESS

[76] Inventor: Theodore G. Hollinger, 20606 Coventry Cir., Bend, Oreg. 97702

[21] Appl. No.: 842,778

[22] Filed: Mar. 21, 1986

[51] Int. Cl.$^4$ .................................................. H01L 21/385
[52] U.S. Cl. ..................................... 437/164; 437/913
[58] Field of Search ............... 148/187, 188; 29/571; 437/164, 913

[56] References Cited

U.S. PATENT DOCUMENTS

| | | | |
|---|---|---|---|
| 3,458,781 | 7/1969 | Simon | 148/187 X |
| 3,600,647 | 8/1971 | Gray | 29/576 X |
| 4,345,265 | 8/1982 | Blanchard | 148/187 X |
| 4,375,999 | 3/1983 | Nawata et al. | 148/188 X |
| 4,376,286 | 3/1983 | Lidow et al. | 357/23 |
| 4,397,887 | 8/1983 | Aytac et al. | 148/188 X |
| 4,404,733 | 9/1983 | Sasaki | 148/188 X |
| 4,416,708 | 11/1983 | Abdoulin et al. | 148/187 |
| 4,499,652 | 2/1985 | Shrivastava | 29/571 |
| 4,596,068 | 6/1986 | Peters | 29/571 |
| 4,599,118 | 7/1986 | Han et al. | 29/571 X |

FOREIGN PATENT DOCUMENTS 1390135 4/1975 United Kingdom .

Primary Examiner—George T. Ozaki

[57] ABSTRACT

A method for making a semiconductor device, such as a power-MOS transistor, wherein dopant is introduced into the structure underlying a lead contact pad to create a conducting subregion which minimizes electrical conductive breakdown.

5 Claims, 5 Drawing Sheets

SEMICONDUCTOR DOPING PROCESS

BACKGROUND AND SUMMARY OF THE INVENTION

This invention relates to a semiconductor doping process, and more particularly to a process for introducing dopant in a selected region in a semiconductor device wherein, without such dopant, the region would be prone to electrical breakdown. For the purpose of illustration, a preferred manner of practicing the invention is described in conjunction with the making of a field-effect, power-MOS type transistor wherein the invention has been found to offer particular utility.

In the packaging of a semiconductor device, such as a field-effect, power-MOS transistor, it is, of course, necessary to make electrical contact (through leads) to the several electrodes (gate, source, drain) in the device. Presently, the best-available wire-bonding technology to achieve this requires, because of the relatively gross size of even the smallest wire which is practically handleable, enlarged bonding pad areas in a device to provide an appropriate contact expanse for a wire lead.

In a power-MOS transistor, one of such enlarged bonding areas is provided for the gate, and inclusion of such an area, under certain circumstances, presents electrical breakdown problems. More specifically, for a given desired operational switching voltage in such a device, there is a maximum allowable spacing between what might be thought of as the electrical breakdown-prone zones in order to assure that breakdown does no occur. In a device of the type just mentioned, the zones referred to take the form of the so-called channels therein.

In a typical power-MOS transistor, a region which is especially problematic is that region which extends as an expanse beneath the gate contact area, which region is at least partially bounded by channels whose separation greatly exceeds the maximum permissible spacing to prevent breakdown. For example, in such a transistor, designed to operate with a switching voltage of 500-volts, the maximum allowable adjacent channel spacing is about 2-mils, yet in the gate contact area, it would be typical to find an adjacent channel spacing of about 12-mils. As was mentioned earlier, this greater spacing results as a consequence of having to provide a large enough contact area to enable a wire lead to fit.

A general object of the present invention, therefore, is to provide a unique doping process to achieve an improved semiconductor structure which, while allowing wide spacing between breakdown-prone zones to accommodate lead attachment, nevertheless substantially completely solves and avoids the problem of electrical breakdown.

In accordance with a preferred manner of practicing the invention, and as will be described more fully below, the invention proposes the creation of a specially doped region between such zones which, in effect, establishes an electrical connection with the zones in a manner which obviates electrical breakdown. In the case of a field-effect, power-MOS transistor, and referring for a moment specifically to what is known as an N-channel device where the channels contain a P- dopant, the invention proposes a technique for establishing a P- doped subregion extending between the adjacent channels underlying the gate contact areas, which subregion makes an electrical connection, and preferably a conductive connection, between the channels. This resulting structure eliminates the build-up and concentration of electrical fields which can cause debilitating electrical breakdown.

In general terms, the invention is practiced by forming over the region that extends between breakdown prone zones of the type mentioned, an oxide layer which contains a dopant that is electrically compatible with the N/P characteristic of the zones. Thereafter, dopant in this layer is driven therefrom into the region to create a doped subregion. Such driving action establishes an electrical connection between the newly doped subregion and the zones, which connection obviates electrical breakdown. Preferably, the steps of the invention are performed in such a manner that the penetration thickness of the newly doped subregion closely matches the penetration thickness of the zones between which it extends, with the boundaries of the subregion flowing with only minor curvature into the boundaries of the zones.

These and other objects and advantages which are attained by the invention will become more fully apparent as the description which now follows is read in conjunction with the accompanying drawings.

DETAILED DESCRIPTION OF THE INVENTION

Figure 1:
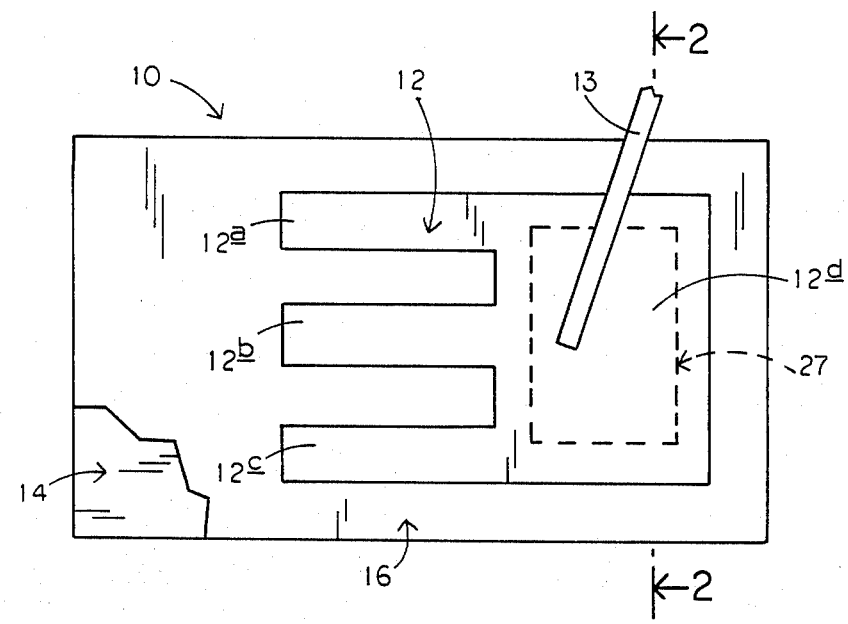
FIG. 1 is a simplified plan view, with a small portion broken away, illustrating a field-effect, power-MOS transistor (semiconductor device) which has been manufactured in accordance with the procedure of the present invention.
Figure 2:
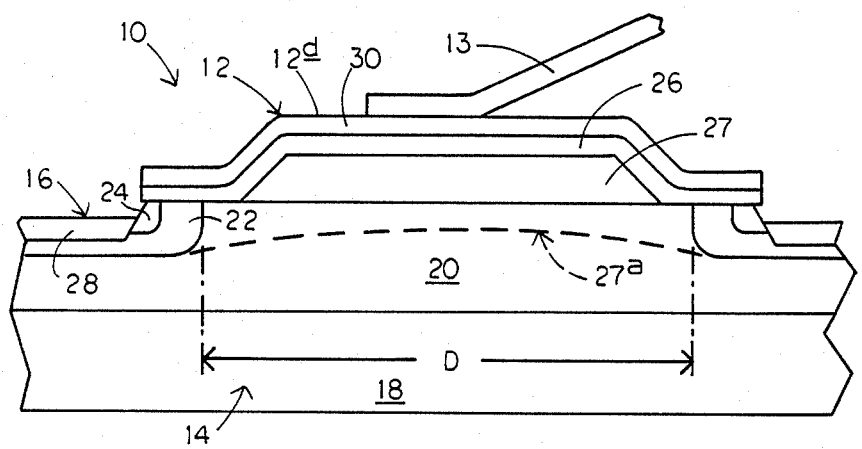
FIG. 2 is an enlarged fragmentary section through the device of FIG. 1, taken generally along line 2—2 in FIG. 1.
Figure 3:
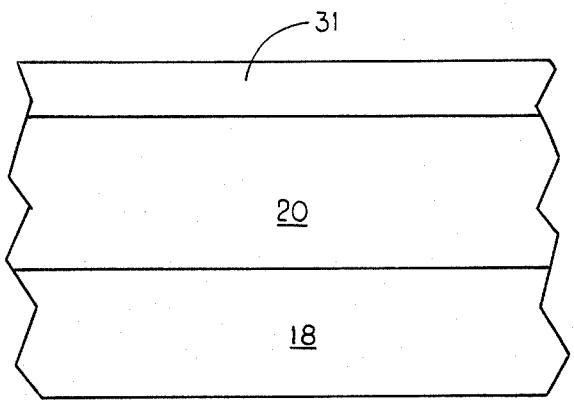
FIGS. 3-13, inclusive, illustrate successive steps in the manufacture of the FIG. 1 device, with certain ones of these figures illustrating a single manufacturing step, and others, as will be explained, illustrating plural manufacturing steps.

Turning now to the drawings, and directing attention first to FIGS. 1 and 2, indicated generally at 10 is an N-channel, field-effect, power-MOS transistor (semiconductor device) which has been constructed in accordance with the process of the present invention. Transistor 10, except as will be explained shortly, is otherwise typical in construction to like prior art devices, and includes a gate 12, a drain 14, and a source 16. In the particular transistor embodiment shown in these two figures, gate 12 includes three "fingers" 12a, 12b, 12c, and an enlarged bonding pad area 12d (gate contact area) to which a wire lead 13 is shown attached.

In the description which now immediately follows, certain dimensions are given. These dimensions are specific to a transistor designed to act as a 500-volt switch.

As will be well understood by those skilled in the art, extending along and about the outline of gate 12, as the same is viewed in FIG. 1, is what is known as the "body" of the transistor which defines what is known as the channel in the transistor. In what might be thought of as the finger region under the gate, laterally adjacent channel stretches have a spacing of about 1 mil which is well within the maximum allowable channel spacing of 2 mils, as dictated by the desired operating voltage for the transistor. However, in the region under bonding pad area 12d, laterally adjacent channel stretches have a much greater spacing, namely about 12 mils, which far exceeds the maximum functionally allowable spacing. It is in this region where the transistor is prone to electrical breakdown, and accordingly, the laterally adjacent channels which at least partially bound this region are referred to herein as breakdown-prone zones.

Briefly reviewing now conventional aspects of transistor 10, and looking particularly for a moment at FIG. 2, one can clearly see the various layers and functional regions which make up the transistor. More specifically, in drain 14 there is a base N+ doped layer 18 and an N− doped epitaxial layer 20. Also included in the structure of transistor 10 is a P− doped layer 22 which forms the so-called "body" in the transistor, and residing therein an N+ doped layer 24 which forms the source in the transistor. Layers 22, 24, where they extend under gate 12, define the transistor's channel, and as can be seen in FIG. 2, the two adjacent channels which lie under opposite sides of area 12b shown in the figure are spaced apart by a distance D which, as mentioned earlier, is about 12-mils. This is a channel spacing situation which, but for the present invention, leads to electrical breakdown problems.

Continuing with a description of transistor 10, residing immediately above the last-mentioned three layers, except in the region under area 12d is a gate-oxide layer (silicon dioxide) 26, and two metalization layers 28, 30. These two metal layers are typically formed, and herein are formed, of aluminum. Layer 28 acts as an electrical contact for the source, and layer 30 forms previously mentioned gate 12.

Underlying gate-oxide layer 26 in the region beneath pad area 12d is an island 27 which, as seen in FIG. 1, has a rectangular outline, and which, as seen in FIG. 2, has an overbeveled margin where it extends downwardly from its upper surface in FIG. 2 toward the top surface of layer 20. In other words, the thickness of island 27 diminishes as one progresses toward the breakdown-prone zones. Island 27, in addition to offering certain mechanical advantages which are discussed also acts as a convenient and important structure for introducing, according to the invention, into the region immediately therebelow in layer 20, also referred to herein as a subregion, a P− dopant which is compatible with the dopant in layer 22. This doped subregion is indicated by dashed line 27a.

As can be seen clearly in FIG. 2, doped subregion 27a has a penetration depth, relative to the top surface of layer 20, which is substantially the same as the penetration depth of layer 22. Further, at the locations where subregion 27a is adjacent layer 22, the same has a boundary profile which tends to flow smoothly with minor curvature to define a boundary interface connective structure with layer 22. Were subregion 27a substantially more penetrative than layer 22, and/or were the boundary interface regions of joinder with layer 22 sharply curved, electrical breakdown problems could still occur.

With subregion 27a located is shown, with a dopant having an N/P characteristic (herein P−) which is compatible with the N/P characteristic of layer 22, electrical fields which exist during operation of transistor 10 under area 12d dispose field lines in such a manner that electrical breakdown is avoided. In effect, subregion 27a reduces to substantially zero the effective electrical distance between laterally adjacent channels under area 12d.

As was mentioned briefly above, island 27 functions in an important manner in the practice of the invention for achieving doped subregion 27a. So, turning attention now to FIGS. 3–13, inclusive, let us consider how transistor 10 has been formed in accordance with the invention.

Layers 18, 20 reside in the usual commercially available silicon wafer, and may be thought of herein as making up the "starting material" for the manufacture of transistor 10. In the particular structure now being described, layer 18 has a thickness of about 15 mils and a resistivity of about 0.007–0.02 ohm-centimeters. Epitaxial layer 20 has a thickness of about 36–44 microns, and a resistivity of about 16–22 ohm-centimeters.

To begin with, and through any suitable technique, a doped glass (dielectric, oxide) layer 31 (see FIG. 3) with a thickness of about 7000 Angstroms is formed over layer 20. Preferably, the material making up layer 31 is the same (silicon dioxide) as that which is used to make gate-oxide layer 26. Dopant in layer 31, shown generally at 31a, must be electrically compatible, with the dopant present in layer 22. While various dopant materials may be used for this purpose, the dopant chosen herein is the same as the dopant in layer 22—namely, boron. At this stage in the manufacture of transistor 10, dopant density in layer 31 is about 3% by weight boron. As will become apparent, ultimately resulting island 27 comes out of layer 31.

Figure 4:
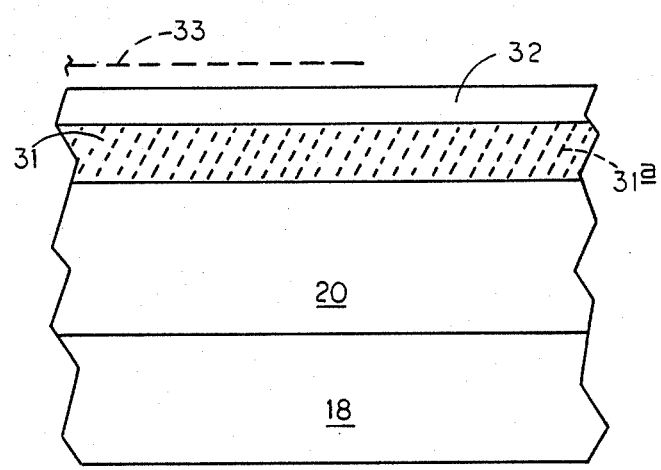

FIG. 4 illustrates the preparation, by any conventional pinhole-free technique, of a negative photoresist layer 32 over layer 31. Obviously, a positive photoresist layer could be employed if so desired. Next, a mask, such as that shown generally and fragmentarily at 33 in FIG. 4, is placed over layer 32 to create, through conventional photolithography techniques, the exact outline for what will end up becoming the upper surface of island 27.

Figure 5:
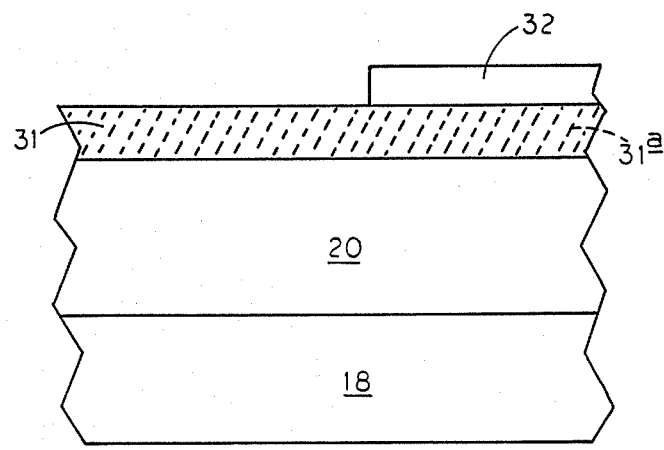

FIG. 5 shows the resulting structure after development of the light-exposed photoresist.

Figure 6:
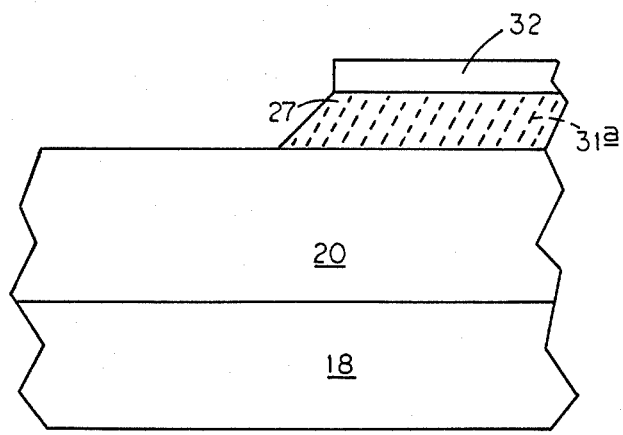

Turning attention now to FIG. 6, glass layer 31 is etched conventionally to produce previously mentioned island 27, with the sloped overbeveled margin mentioned earlier.

Figure 7:
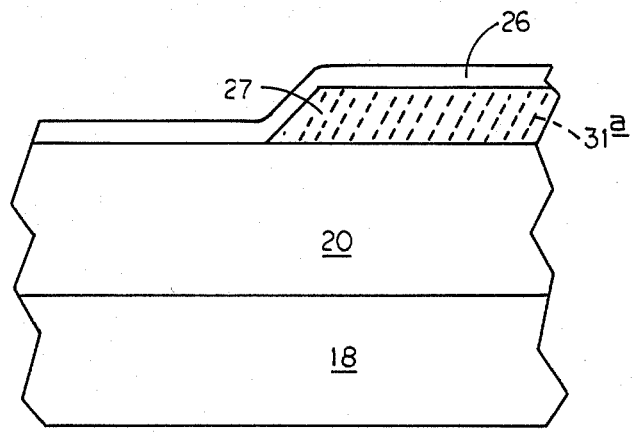

The next step in the manufacture of transistor 10 is seen in FIG. 7, where gate-oxide layer 26 is suitably formed over island 27 and over the upper surface of layer 20 after removal of photoresist layer 32. This layer has a thickness herein of about 1500 Angstroms.

Figure 8:
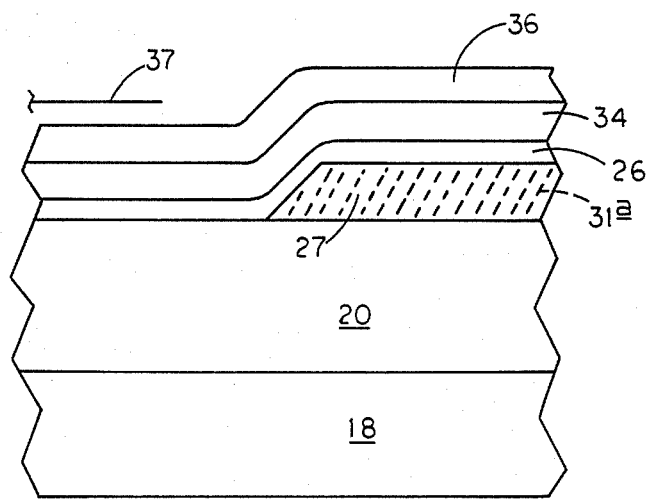
Figure 9:
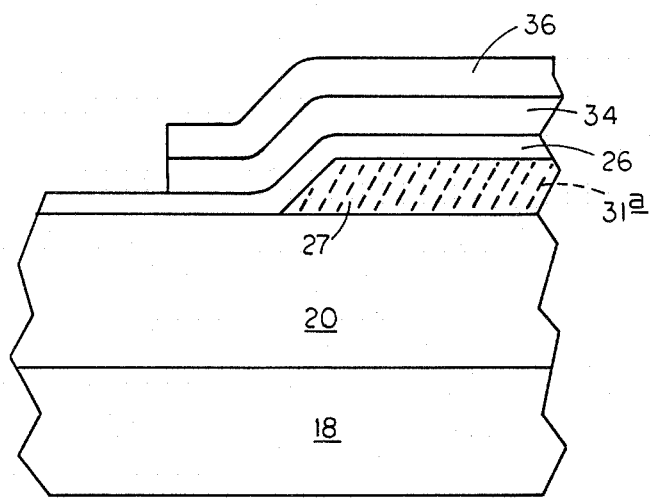

FIG. 8 illustrates the next three successive steps. The first of these involves conventional chemical vapor deposition of a layer 34 of polysilicon, with a thickness of roughly 7000 Angstroms. While, for reasons not relating to the present invention, polysilicon is a preferred material for layer 34, others which may be used include silicon nitride, refractory-metal silicide, and doped oxides. Then, conventionally formed over layer 34 is a negative photoresist layer 36.

The third step illustrated in FIG. 8 involves conventional masking to produce the overall layout of transistor 10. A portion of an appropriate mask is shown fragmentarily at 37. Through conventional photolithography, photoresist layer 36 is exposed to light and then, in one of the steps illustrated in FIG. 9, developed to remove photoresist from layer 36 in the areas not exposed to light. The next step, illustrated in FIG. 9, involves etching of polysilicon layer 34 to produce a pattern therein matching the open pattern developed in layer 36.

Figure 10:
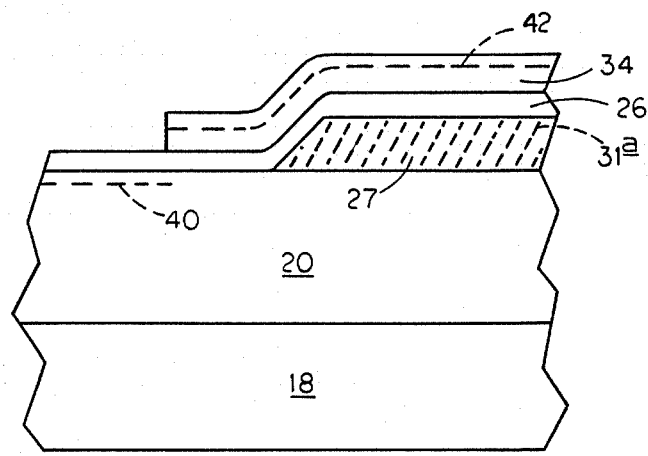

Turning attention now to FIG. 10, the next step which is performed is the removal of photoresist layer 36, and accordingly this layer is absent in FIG. 10. What then follows, as is illustrated in FIG. 10, is a first implant step, which takes the form of a boron implant that will result, as will be explained, in previously mentioned layer 22. The boron implant step is performed in a conventional implanter at an energy level of about 160 KEV to produce the desired implant density in layer 20. Dashed line 40 in FIG. 10 illustrates the material implanted in layer 20 by this step. Dashed line 42 illustrates that there is some penetration of boron into layer 34, but not a complete penetration of this layer.

Figure 11:
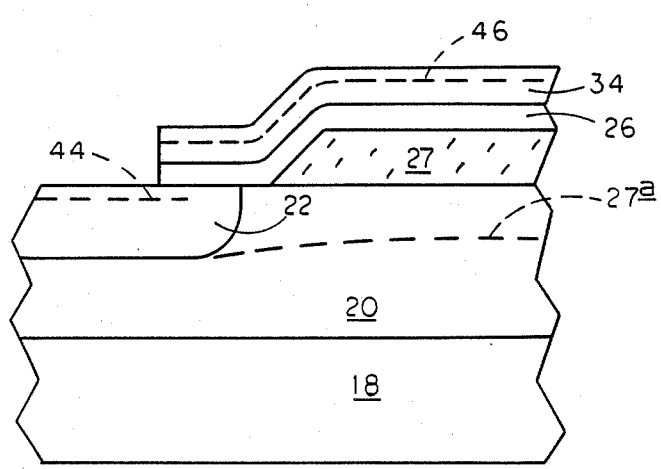

FIG. 11 illustrates the next three steps in the manufacture of transistor 10. The first step performed is a diffusion step to diffuse the implanted boron into layer 20 while at the same time driving boron dopant, according to the invention, in island 27 also into layer 20 to form doped subregion 27a. This diffusion step takes place in a conventional diffusion furnace at a typical temperature of about 1150° C. for about 3–8 hours. What results from this step is the beginning of previously described layer 22, and, of course, doped subregion 27a. An important contribution which is made by the overbeveled margin of island 27 is that, progressing outwardly along the island to its terminal edge, less and less dopant becomes available for driving into layer 20. As a consequence, this shape in island 27 results in a penetration profile for subregion 27a which leads to smoothly joining boundary interfaces (minor curvature) with layer 22. Also, the penetration thickness of subregion 27a closely matches the penetration thickness of layers 22. Driving of the boron dopant to produce subregion 27a thereby establishes a connection, and preferably a conductive, connection with layers 22.

Still with reference to FIG. 11, next, layer 26 is etched, by any commercial etching technique, to transfer thereinto a matching pattern of the openings present in polysilicon layer 34. Finally illustrated in FIG. 11 is a second implant step where phosphorus is implanted, again in a conventional implanter at an energy level about 160-KEV. Dashed, line 44 illustrates the material implanted in the upper portion of layer 22, and dashed line 46 illustrates some penetration of the phosphorus into layer 34.

Figure 12:
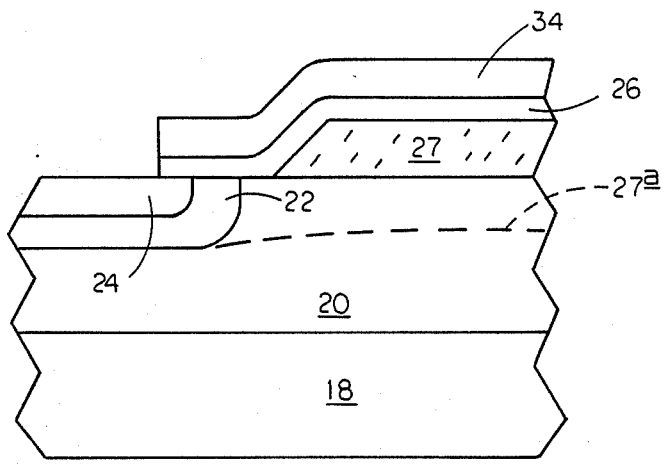

FIG. 12 illustrates the second and final diffusion step which also takes place in a conventional diffusion furnace, typically at a temperature of about 1,100° C. for about 1–3 hours. What, as a consequence, results completely within the boundaries of layer 22 is a new diffused region which will result, ultimately, in previously described layer 24.

During the diffusion step just described, a thin oxide film (not shown) grows incidentally on the surface of layer 20, and the next step in the manufacturing procedure is to remove this thin oxide layer by any suitable conventional etching technique.

Figure 13:
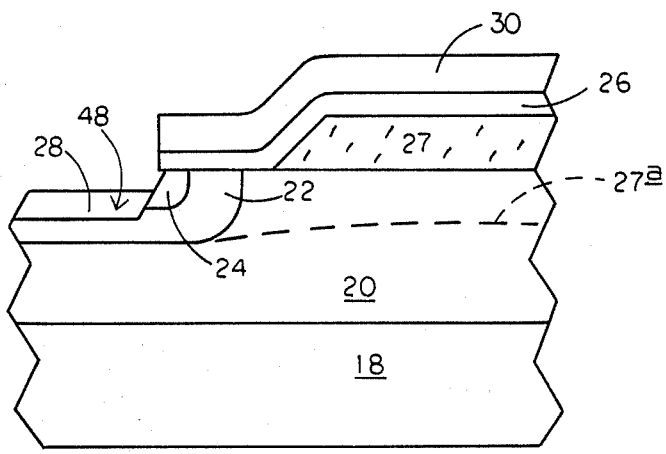

FIG. 13 illustrates the final steps in the preparation of transistor 10. The first of these involves the controlled etching of the slope-walled trench shown generally at 48 in FIG. 13. This etch also results, desirably, in the removal of polysilicon layer 34.

The final step to be described herein involves metalization, wherein aluminum is preferably cold-evaporated to create source layer 28 and gate layer 30. The tapered edges of island 27 assure that layer 30, without discontinuities, covers the entirety of gate-oxide layer 26.

Thus, transistor 10 has been prepared through a unique procedure to create a specially doped subregion which obviates the problem of electrical breakdown that could otherwise occur in the region underlying the gate contact pad. The convenient use of a structure like island 27, predoped appropriately, as the carrier vehicle for dopant to drive into this region, yields a doped subregion which is properly profiled to minimize the creation of any new electrical breakdown problems.

As a review, the key steps of practicing the invention include: (a) forming a doped oxide layer over the region in a semiconductor device which extends between breakdown-prone zones; (b) driving dopant which is contained in this oxide layer therefrom to create a subregion in the mentioned region with a thickness that closely matches the thickness of the zones; and (c) by the act of so driving this dopant, establishing an electrical connection, and preferably a conductive connection, with the zones.

Accordingly, while a preferred manner of practicing the invention has been described, it should be understood that variations and modifications are possible without departing from the spirit of the invention.

It is claimed and desired to secure by letters Patent:

1. In the manufacture of a semiconductor device which would otherwise include adjacent, spaced zones on opposite sides of an enlarged surface area in the device, with these zones having a known N/P characteristic and exhibiting a proneness to electrical breakdown, forming in a substantially coextensive/contractive manner over the region between such zones an oxide layer which contains a dopant that is electrically compatible with the N/P characteristic of such zones, driving the dopant in such layer therefrom substantially coextensively into, and across the expanse of, such region to create therein a doped subregion, and by said driving, establishing an electrical connection between such subregion and such zones which obviates electrical breakdown.

2. The process of claim 1, wherein said driving establishes conductive contact between such subregion and such zones.

3. The process of claims 1 or 2, wherein said forming includes shaping such layer, where the same is adjacent such zones, with a thickness which diminishes progressing toward the zones.

4. The process of claims 1 or 2, wherein said driving creates such doped subregion with a thickness in such region which, throughout, closely matches the thickness of the N/P characteristic in such zones.

5. The process of claim 1 or 2, wherein said forming includes shaping such layer, where the same is adjacent such zones, with a thickness which diminished progressing toward the zones, and said driving creates such doped subregion with a thickness in such region which, throughout, closely matches the thickness of the N/P characteristic in such zones.

* * * * *

UNITED STATES PATENT AND TRADEMARK OFFICE
CERTIFICATE OF CORRECTION

PATENT NO. : 4,766,094

DATED : August 23, 1988

INVENTOR(S) : Theodore G. Hollinger

It is certified that error appears in the above-identified patent and that said Letters Patent is hereby corrected as shown below:

-- On the title page, below item 76, insert item 73: Assignee: Advanced Power Technology, 405 S.W. Columbia Avenue, Bend, Oregon --.

Signed and Sealed this

Fifth Day of June, 1990

Attest:

HARRY F. MANBECK, JR.

Attesting Officer

Commissioner of Patents and Trademarks